(12) United States Patent
Ho

(10) Patent No.: US 6,652,655 B1
(45) Date of Patent: Nov. 25, 2003

(54) METHOD TO ISOLATE MULTI ZONE HEATER FROM ATMOSPHERE

(75) Inventor: Henry Ho, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 194 days.

(21) Appl. No.: 09/611,942

(22) Filed: Jul. 7, 2000

(51) Int. Cl.[7] .................... C23C 16/00; H05H 1/00
(52) U.S. Cl. ................ 118/725; 118/728; 156/345.52; 156/345.51
(58) Field of Search .................. 118/725, 728, 118/724, 719; 156/345.52, 345.51, 345.53, 345.54, 345.32; 219/65, 411, 390, 391, 496

(56) References Cited

U.S. PATENT DOCUMENTS

| | | | |
|---|---|---|---|
| 3,536,892 A | | 10/1970 | Walther et al. |
| 4,777,022 A | | 10/1988 | Boldish et al. |
| 4,949,783 A | * | 8/1990 | Lakios et al. ............ 165/80.1 |
| 5,091,208 A | * | 2/1992 | Pryor ...................... 427/573 |
| 5,094,885 A | | 3/1992 | Selbrede |
| 5,203,958 A | * | 4/1993 | Arai et al. ................ 216/67 |
| 5,994,678 A | | 11/1999 | Zhao et al. |
| 6,111,225 A | * | 8/2000 | Ohkase et al. ............ 219/390 |
| 6,372,048 B1 | * | 4/2002 | Futamura et al. ......... 118/729 |

OTHER PUBLICATIONS

PCT Search Report, Jan. 17, 2002, PCT/US 01/20095.

* cited by examiner

*Primary Examiner*—Parviz Hassanzadeh
(74) *Attorney, Agent, or Firm*—Blakely Sokoloff Taylor & Zafman

(57) ABSTRACT

An apparatus for wafer processing that includes a wafer reaction chamber containing a heater within, the heater including an interior volume containing at least one heating element, a fluid inlet port, and a fluid vent port positioned to vent the fluid outside the wafer reaction chamber. Additionally, the interior volume has a seal that isolates it from the wafer reaction chamber.

6 Claims, 8 Drawing Sheets

METHOD TO ISOLATE MULTI ZONE HEATER FROM ATMOSPHERE

BACKGROUND OF THE INVENTION

1. Field of the Invention

The invention relates to heating mechanisms for process chambers, and particularly, to heating mechanisms for chemical vapor deposition chambers.

2. Description of Related Art

Chemical vapor deposition (CVD) is a process for depositing various types of films on substrates and is used extensively in the manufacture of semiconductor-based integrated circuits such as, for example, the processing of semiconductor wafers (wafers) to form individual integrated circuit devices. In typical CVD processing, a wafer or wafers are placed in a deposition or reaction chamber and reactant gasses are introduced into the chamber that are decomposed and reacted at a heated surface to form a thin film on the wafer or wafers.

A CVD reactor vessel adds coatings to wafers using a multi-zone resistive heater (heater) to react the coating chemistry once applied to a wafer surface. The heater includes at least two resistive heating rods disposed within a tube to contact a spiral heater coil (coil) embedded within a heater disk (disk). The distinct heating rods are not equadistantly centered about the tube centerline nor the coil. Instead they are offset, the result being that areas of the heating disk can have a wide range of temperatures provided by varying the electrical power applied to the individual heating rods. A specially designed surface (susceptor) exists on one side of the heating disk upon which is supported the wafer. The wafer is heated conductively by heat transferred from the heating coil to the susceptor. Upon completion of the deposition of the film onto the wafer, the process gasses are removed, the reaction chamber purged with cleaning chemicals and inert gasses, and the wafer removed.

Initially at assembly, an interior volume of the heater assembly is exposed to atmosphere. Once the heater is assembled, atmosphere will remain contained within. Oxygen in the atmosphere that is contained within the heater assembly will attack the heater components at temperatures above 700° C. As a result, the mechanical strength of the heater components will degrade with use and the heater components will have to be replaced at a cost in parts, labor, and down time for the reactor vessel.

SUMMARY OF THE INVENTION

A wafer processing method, comprising processing a wafer in a reaction chamber comprising a heater having an interior space; heating the reaction chamber with the heater, purging an inert gas into the heater interior space, and venting the inert gas.

BRIEF DESERTION OF THE DRAWINGS

DETAILED DESCRIPTION OF THE INVENTION

The invention generally relates to a method and an apparatus for removing reactive gasses from the interior of a multi resistive heater (heater) used in a semiconductor wafer processing reaction chamber. Wafer processing requires corrosive chemistry to be applied at high temperatures and the heater components that must withstand this environment are currently manufactured from a ceramic material, aluminum nitride (AlN).

While the heater interior is subject to the same heating conditions as the reaction chamber, it is sealed and not exposed to the processing gasses during operation of the reaction chamber. The heater interior is assembled and disassembled in atmosphere and therefore contains atmospheric gasses, in particular oxygen. At operating temperatures greater than 700° C., aluminum nitride when exposed to atmosphere, will react with the oxygen and the material strength of the AlN component will be reduced. As a result, the service life of the heater is reduced.

The heater interior surfaces, made of aluminum nitride, that are exposed to atmosphere and processing heat during wafer processing include; the inside surfaces of a tube, a portion of a heater disk that is covered by the tube, and a set heating rod insulators. A method and apparatus for reducing or eliminating the oxygen from these inner heater surfaces (heater interior) is disclosed. In an embodiment, the method comprises a continual flow of an inert fluid through the interior of the heater to maintain an oxygen free environment. The inert fluid can be a liquid or a gas or combination of gasses that are non-reactive at the operating conditions of the intended use. In another embodiment, a vacuum is placed within the heater interior to ensure no oxygen is present.

Figure 1:
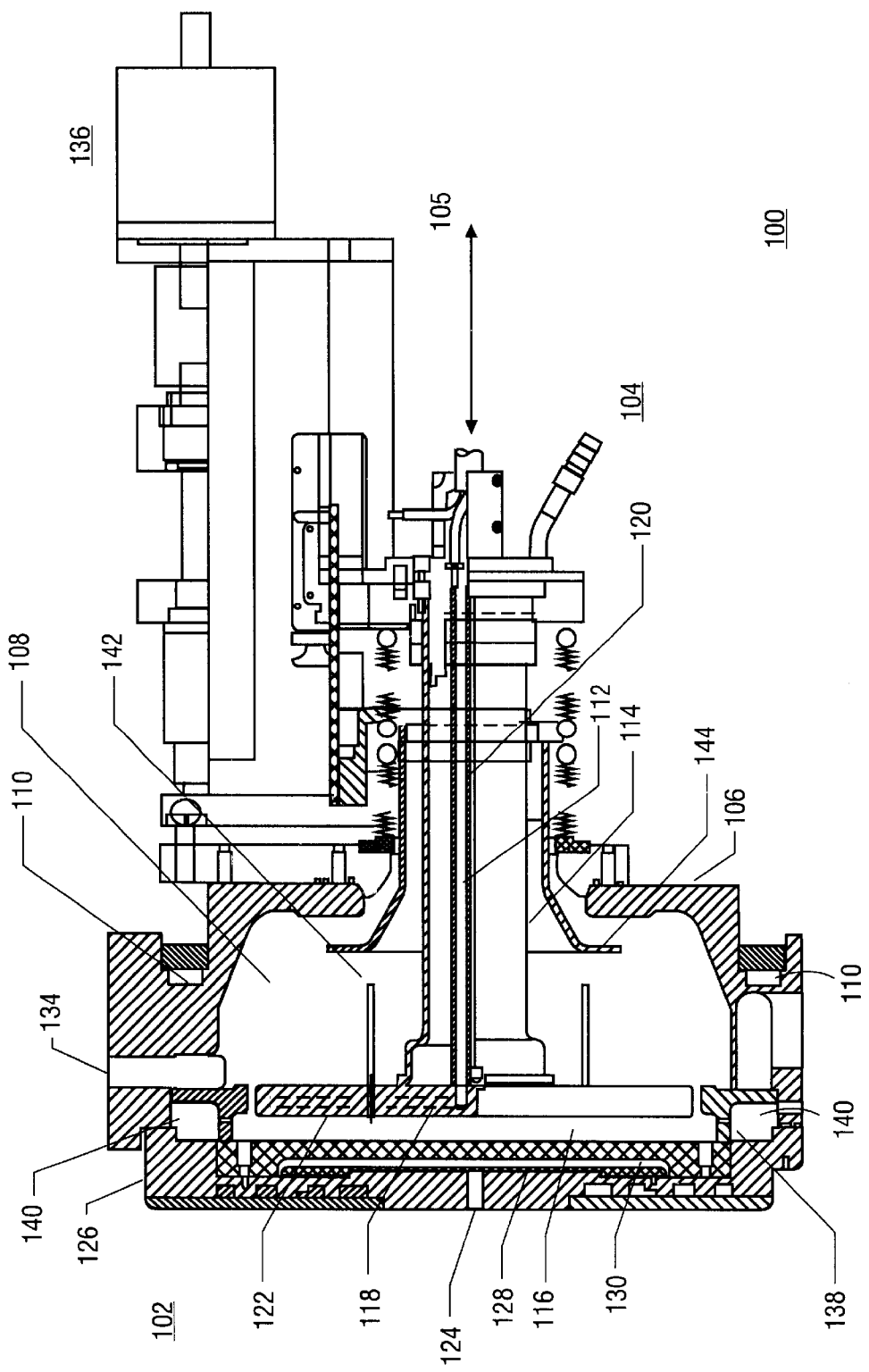
FIG. 1 is an illustration of a CVD reactor assembly.

FIG. 1 is an illustration of a reactor vessel assembly (reactor) 100 that processes a film onto a semiconductor wafer. The reactor vessel assembly 100 is comprised of a chamber assembly 102 and a resistive heater assembly (heater) 104 for use in a chemical vapor deposition apparatus. Heater 104 is designed to move along an axis 105 relative to chamber assembly 102. A chamber body 106 defines a reaction chamber 108 where the reaction between a process gas or gasses and the wafer takes place, e.g., a CVD reaction. Chamber body 106 is constructed, in an embodiment, of 6061-T6 aluminum and has passages 110 for water to flow through to cool chamber body 106. Resident in reaction chamber 108 is resistive heater (heater) 104 that includes several heating elements (rods) 112 running the length of a heater tube (tube) 114 that are made of nickel. At the end of tube 114 is a heating disk (disk) 116 made of sintered AlN. Sintered within disk 116 is a spiral heating element (coil) 118 made of molybdenum. Rods 112 and coil 118 are joined with a brazing and are electrically conductive therein. Rods 112 are thermally insulated with AlN ceramic sleeves 120. Coil 118 provides most of the electrical resistance and therefore most of reaction chamber 108 heating. At the end of heating disk 116 is a recess called a susceptor 122 within that is placed a wafer (not shown). In an embodiment, susceptor 122 has a surface area sufficient to support a 200 millimeter diameter semiconductor wafer (200 mm wafer) while in another embodiment, susceptor 122 has a surface area sufficient to support a 300 millimeter diameter semiconductor wafer (300 mm wafer).

Referring still to FIG. 1, heater 104 is retracted along an axis 105 and the wafer (not shown) is placed in reaction chamber 108 on susceptor 122 through an entry port 134 in a side portion of chamber body 106. To accommodate the wafer for processing, heater 104 is retracted until a surface of susceptor 122 is below entry port 134. A transfer blade (FIG. 2 below) places the wafer (not shown) into chamber body 106 within susceptor 122. Once loaded, entry port 134 is sealed and heater 104 is advanced in a direction toward faceplate 130 by lifter assembly 136. At this point, process gasses controlled by a gas panel (not shown) flow into chamber 108 through port 124, through blocker plate 128, through faceplate 130, and typically react or are deposited onto the wafer (not shown) to form a film (not shown). Using a pressure controlled system (not shown), the pressure in chamber 108 is established and maintained by a pressure regulator or regulators (not shown) coupled to chamber 108.

Figure 2:
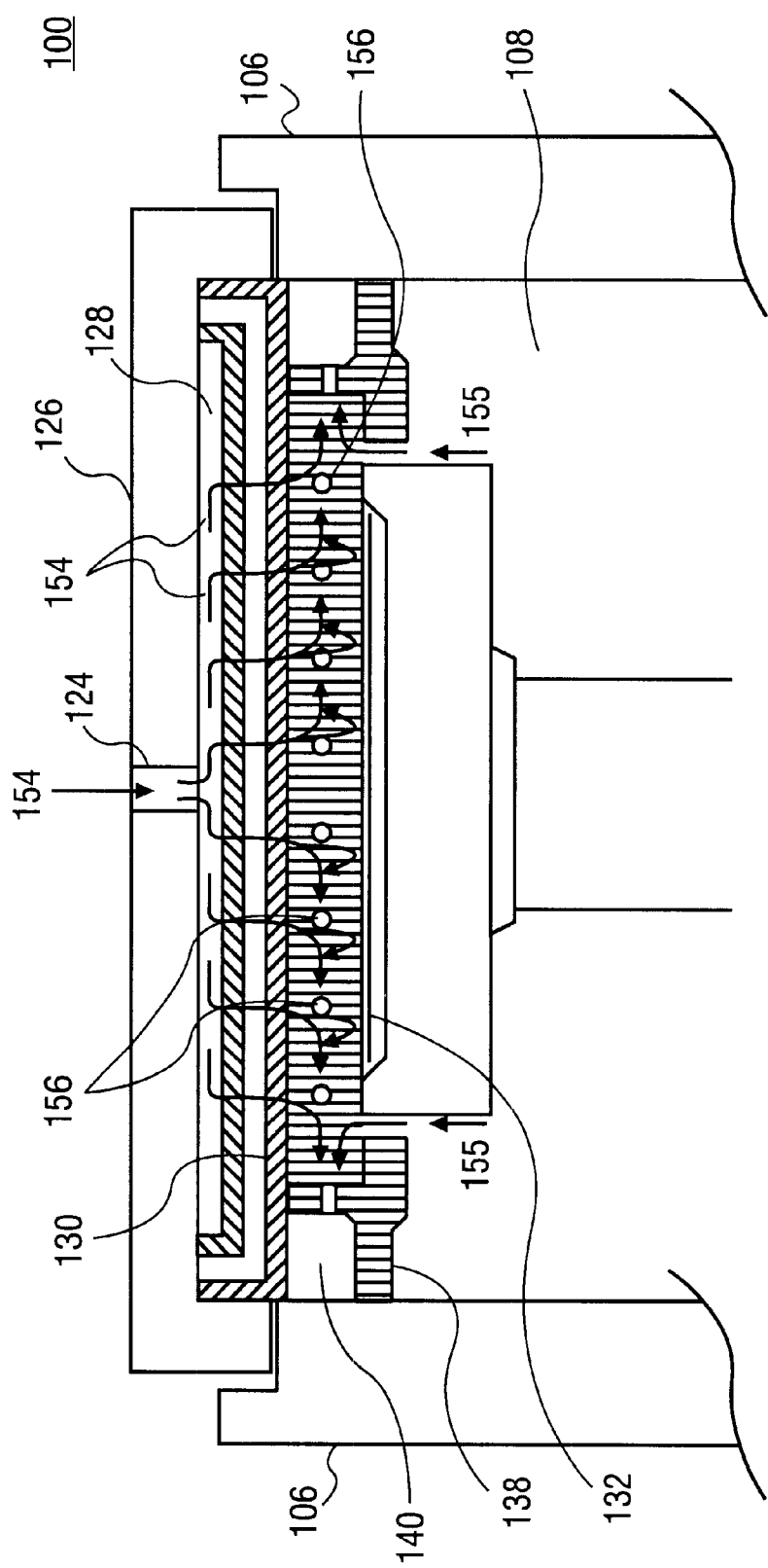
FIG. 2 is an illustration of a portion of the CVD reactor assembly.

FIG. 2 is an embodiment of a simplified processing area around wafer 132 with many of the reactor 100 (FIG. 1) components removed for clarity. Process gasses 154 enter reaction chamber 108 through an opening 124 in a top surface of a chamber lid 126 of chamber body 106. The process gases first pass through a blocker plate 128. Blocker plate 128 is perforated with a set of holes (not shown) to radially distribute the process gas. The process gasses then pass through holes (not shown) of a second perforated plate known as a faceplate 130. Faceplate 130 provides uniform distribution of the process gasses 154 onto wafer 132.

A pump (not shown) draws on a pumping plate 138 at a collection channel 140. As a result, after impacting wafer 132, process gases 154 pass through radial holes 156 in pumping plate 138, are collected in an annular channel 140, and are then directed out of reaction chamber 108. Chamber 108 may then be purged 155, for example, with an inert gas, such as nitrogen.

Figure 3:
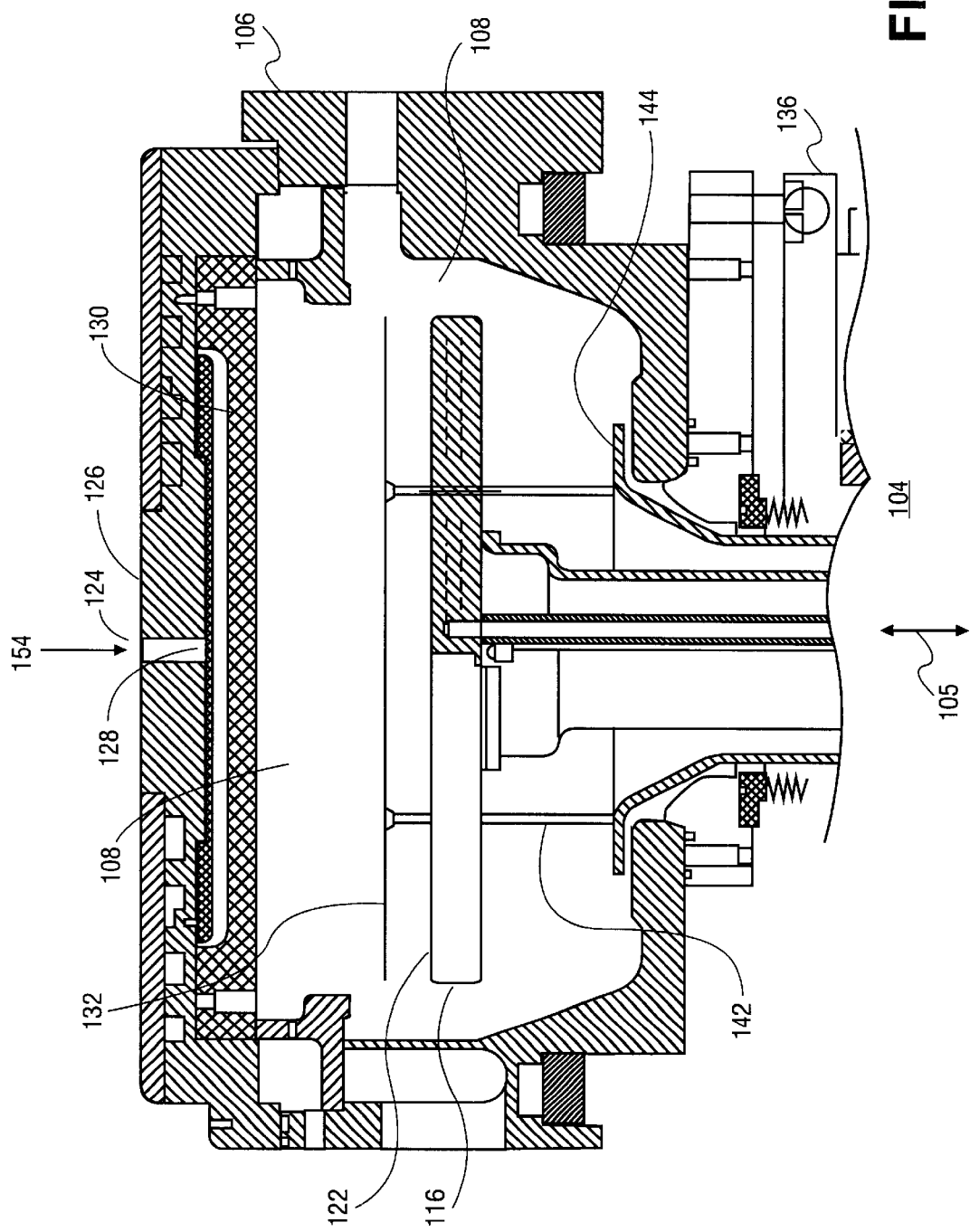
FIG. 3 is an illustration of a portion of the CVD reactor assembly.

In an embodiment, as shown in FIG. 3, after processing and purging, heater 104 is moved in a lower direction (away from a chamber lid 126) by a lifter assembly 136 lift pins 142 are positioned at the base of reaction chamber 108. Lift pins 142 have one end positioned through holes in disk 116 to a contact lift plate 144. As heater 104 moves in a lower direction along axis 105, through the action of a lifter assembly 136, lift pins 142 remain stationary and ultimately extend above the top surface of disk 116 to separate processed wafer 132 from the surface of susceptor 122.

Figure 4:
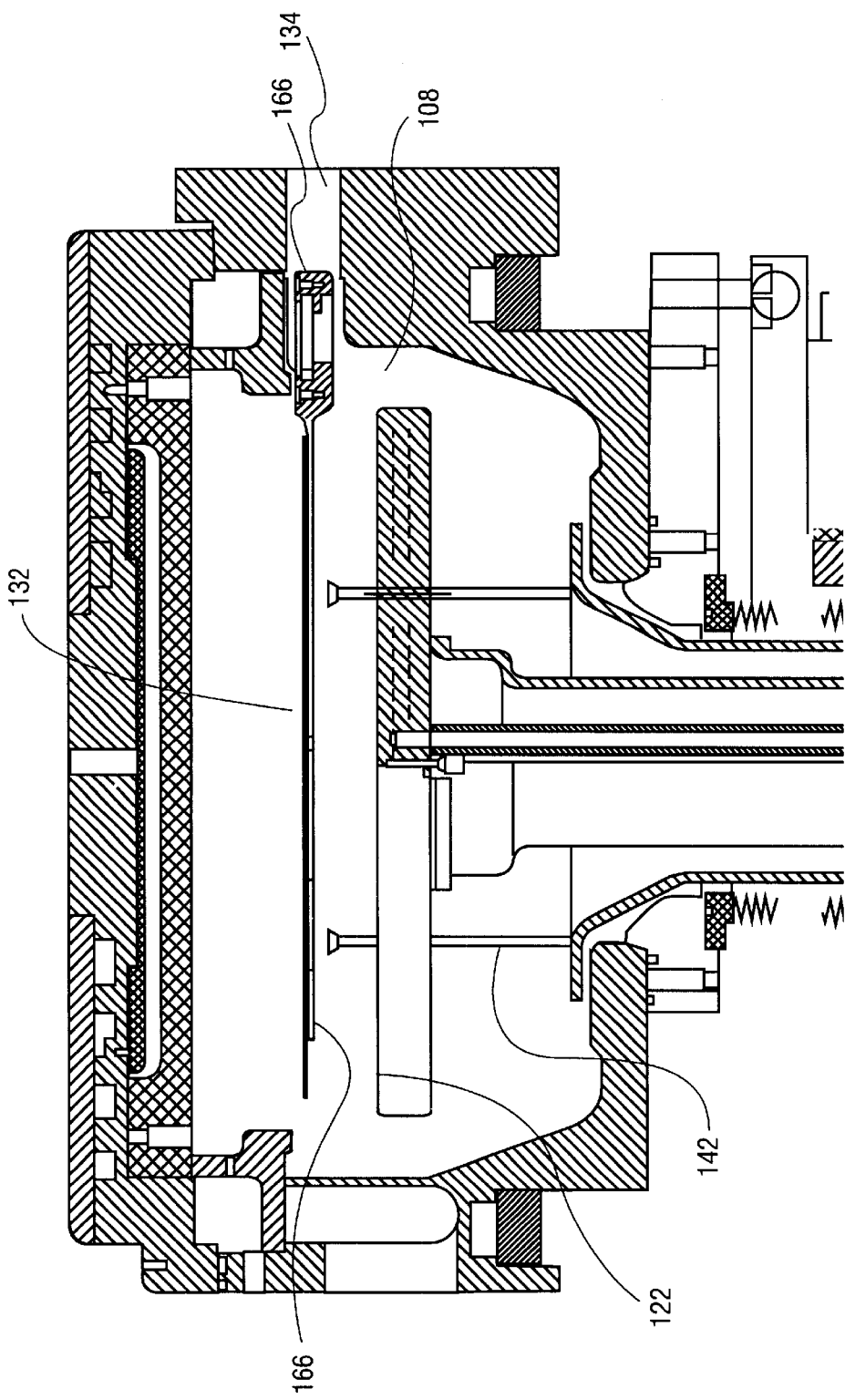
FIG. 4 is an illustration of a portion of the CVD reactor assembly.

In an embodiment, as shown in FIG. 4, once processed, wafer 132 is separated from the surface of susceptor 122 by transfer blade 166 of a robotic mechanism (not shown) that is inserted through opening 134 to remove wafer 132. The steps described above are reversed to bring wafer 132 into a process position.

In a high temperature operation such as low pressure CVD (LPCVD) processing of $Si_3N_4$ or polysilicon, the reaction temperature inside the reaction chamber 108 can be as high as 750° C. or more. Accordingly, the exposed components in reaction chamber 108 must be compatible with such high temperature processing. Such component materials should also be compatible with the process gasses and other chemicals, such as the cleaning chemicals that may be introduced into reaction chamber 108.

Figure 5:
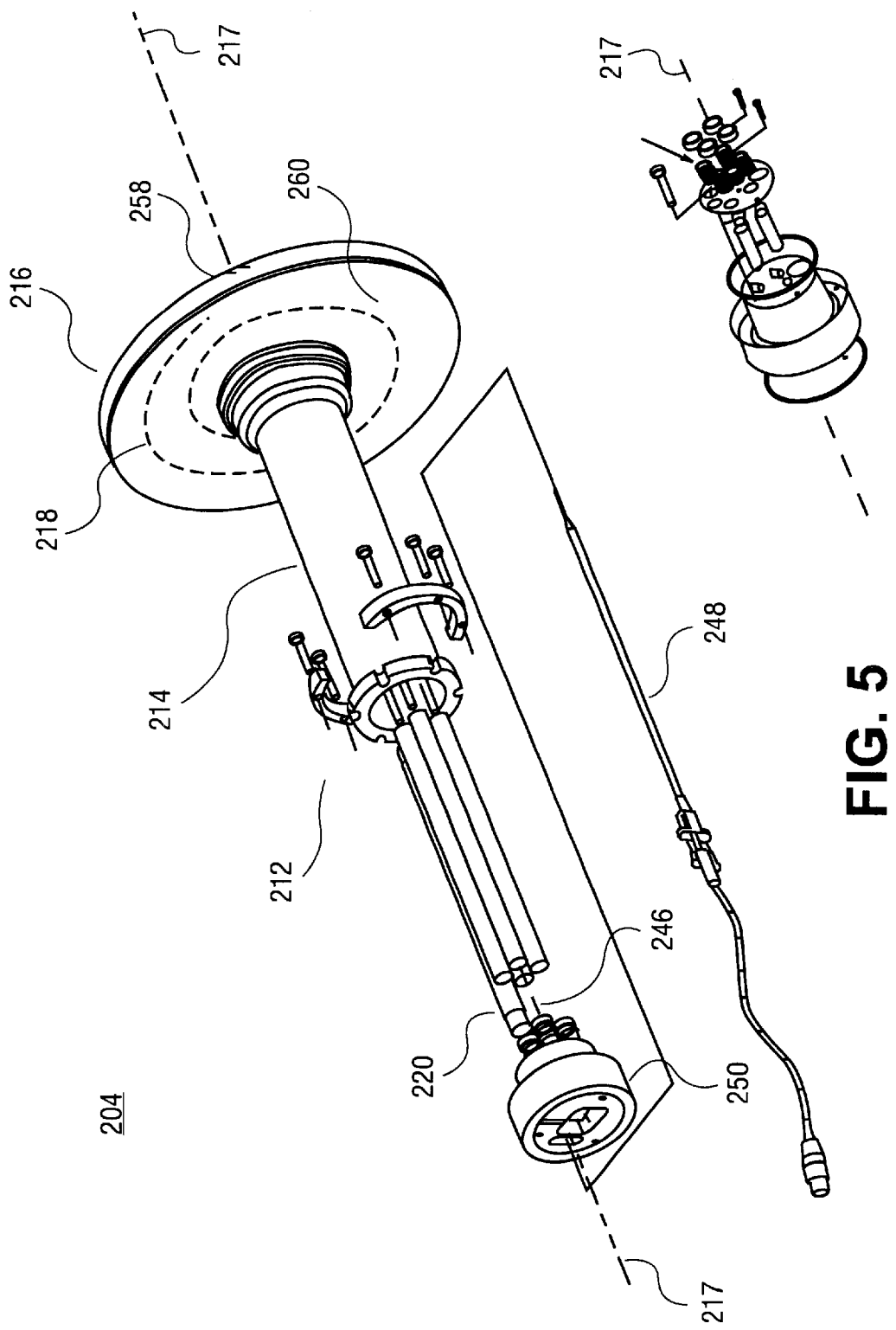
FIG. 5 is a an illustration of a resistive heater assembly.

An exploded view of a dual-zone heater (heater) is shown in an embodiment as illustrated in FIG. 5. In this embodiment, tube 214, disk 216, and heater rod insulators 220 are comprised of sintered and machined aluminum nitride (AlN). Heater disk 216 is sintered having heating coil 218 contained within. Heating coil 218 is bonded to tube 214 through diffusion bonding or brazing as such coupling will similarly withstand the environment of reaction chamber 108 (FIG. 1). Heater assembly 204 includes heater disk 216 having surface 258 with susceptor (not shown) to support a wafer (not shown) and opposite surface 260 to couple to tube 214. Located within tube 214 is two pair of heating rods 212 equidistantly disposed about a common centerline 246. Each heating element 212 is housed in ceramic sleeve (AlN) 220. Each heating rod 212 is made of a material having thermal expansion properties similar to the material of tube 114. In this embodiment, heating rods 212 are made of nickel (Ni), the heating rods 212 having a thermal expansion coefficient similar to aluminum nitride. The heating rods 212 pass through an end cap 250 and are attached to electrical connections (not shown) that enter the end cap 250 from the opposite side. A thermocouple 248 can be positioned within the tube 214 of the heater assembly 204 with the electrical connections placed at the end cap 250. An end of the thermocouple 240 can contact the heater disk 216 to provide a temperature profile of the heater disk 216 during operation.

Figure 6:
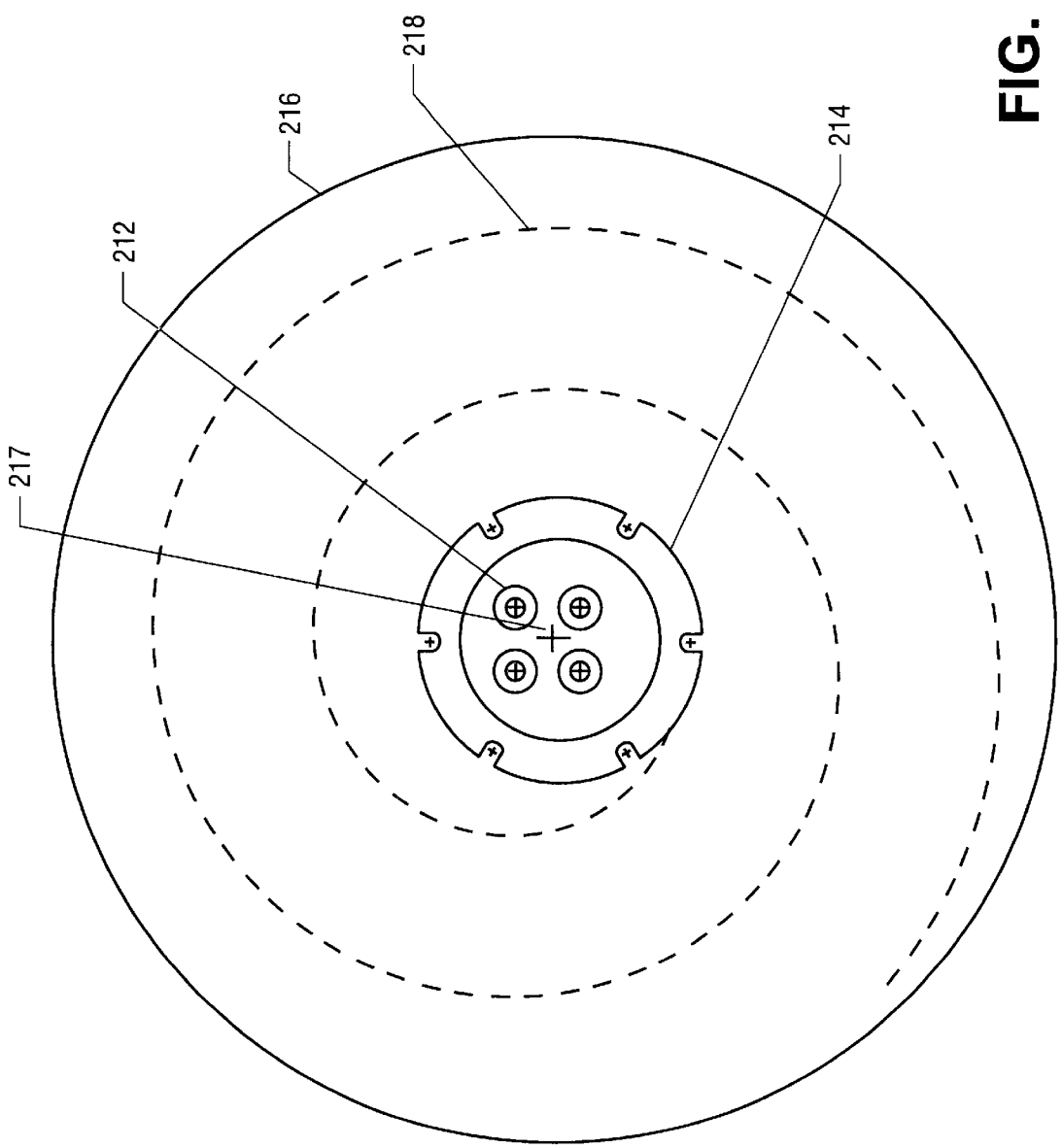
FIG. 6 is an illustration of a spiral coil.

However, in an embodiment as illustrated in FIG. 6, heating rods 212 are not centered around the common centerline 217 of heater disk 216, heater coil 218 (dashed line), and tube 214. This non-centering of heating rods 212 to centerline 217 used by the other components, along with the individual electrical control to each heating rod 212, provides the full temperature range required in CVD processing.

Figure 7:
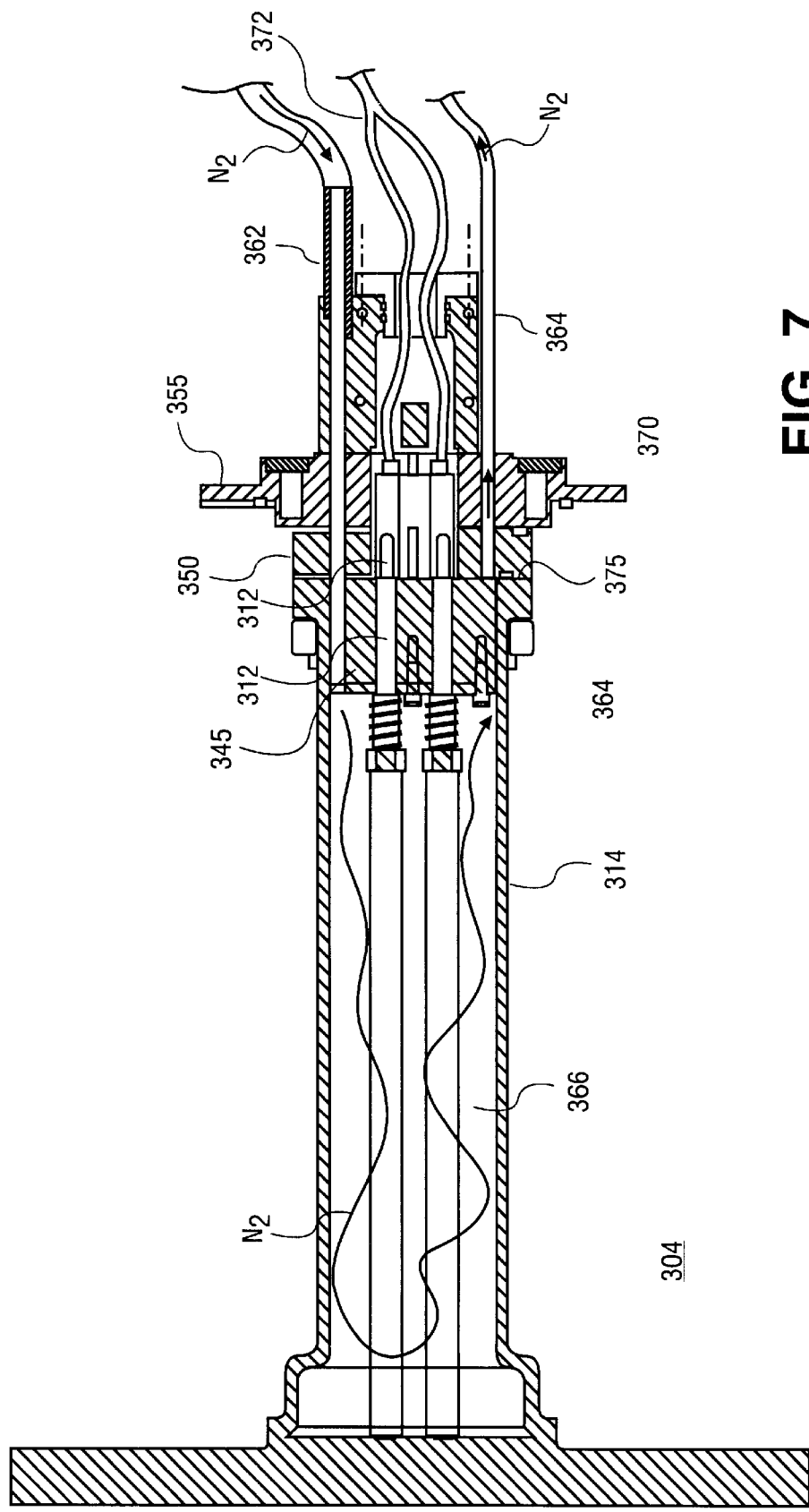
FIG. 7 is an illustration of the resistive heater assembly with purge.

Referring now to an embodiment as illustrated in FIG. 7, atmospheric gasses are purged from the inside of dual-zone heater 304. The purge may be accomplished with a constant flow of a fluid such as an inert gas at a flow rate of approximately 100 cubic centimeters per minute (ccm) through a connector base 355, a connector adapter 350 and into tube 314. For an embodiment, nitrogen may be used as the inert gas. The nitrogen gas pressure applied to the heater, along with the size of the inlet port 362 and vent port 364 should be such as to provide a desired flow rate through the heater 304.

In one embodiment, the flow of nitrogen gas could be at a rate to maintain a pressure of 30 pounds per square inch (psi) when purged into an inlet port 362. The nitrogen can vent out of heater 304 at a vent port 364. The nitrogen used may be refrigerated to a temperature. Refrigerated nitrogen can maintain the temperature below 700° C. within the heater and further reduce AlN material degradation as a result of any small amount of oxygen remaining within the heater interior 366. One method to refrigerate the nitrogen is to mix nitrogen at ambient temperature with nitrogen vapor evaporating off liquid nitrogen The purge may be continuous in that it can be started prior to beginning the wafer process cycle to ensure that oxygen is removed from heater interior 366 before the wafer process cycle begins. In addition, the purge into the heater may be continuous regardless of wafer processing and may only be stopped for heater disassembly to repair or discard.

In an embodiment, a connector assembly 370 connects to heater 304 at one end and provides a multitude of connections. Connector assembly 370 attaches to end cap 345, to heater tube 314, and to chamber body 106 (FIG. 1). Passing through connector assembly 370 is inlet port 362, vent port 364, electrical connections 372 for a thermocouple (not shown), and electrical connections for heater rods 312. Connector assembly 370 includes a connector adapter 350 and a connector base 355. Connector adapter 350 attaches electrical connections 372 to the ends of heater rods 312. Attached to connector adapter 350 is connector base 355 that attaches to chamber body 106 (FIG. 1). Inlet port 362 passes through end cap 345 while venting past the end cap 345 may be accomplished with loose dimensional tolerancing. With this connector assembly 370 configuration, a single operation of attaching connector assembly 370 to heater 304 provides for all the electrical and fluid connections simultaneously. The heater 304 acts as a pressure vessel in that it has pressure integrity. This is accomplished by O-rings 375 placed between components: heater tube 314, end cap 345, connector assembly 370, to reduce loss of inert gas into the reaction chamber 108 (FIG. 1).

Figure 8:
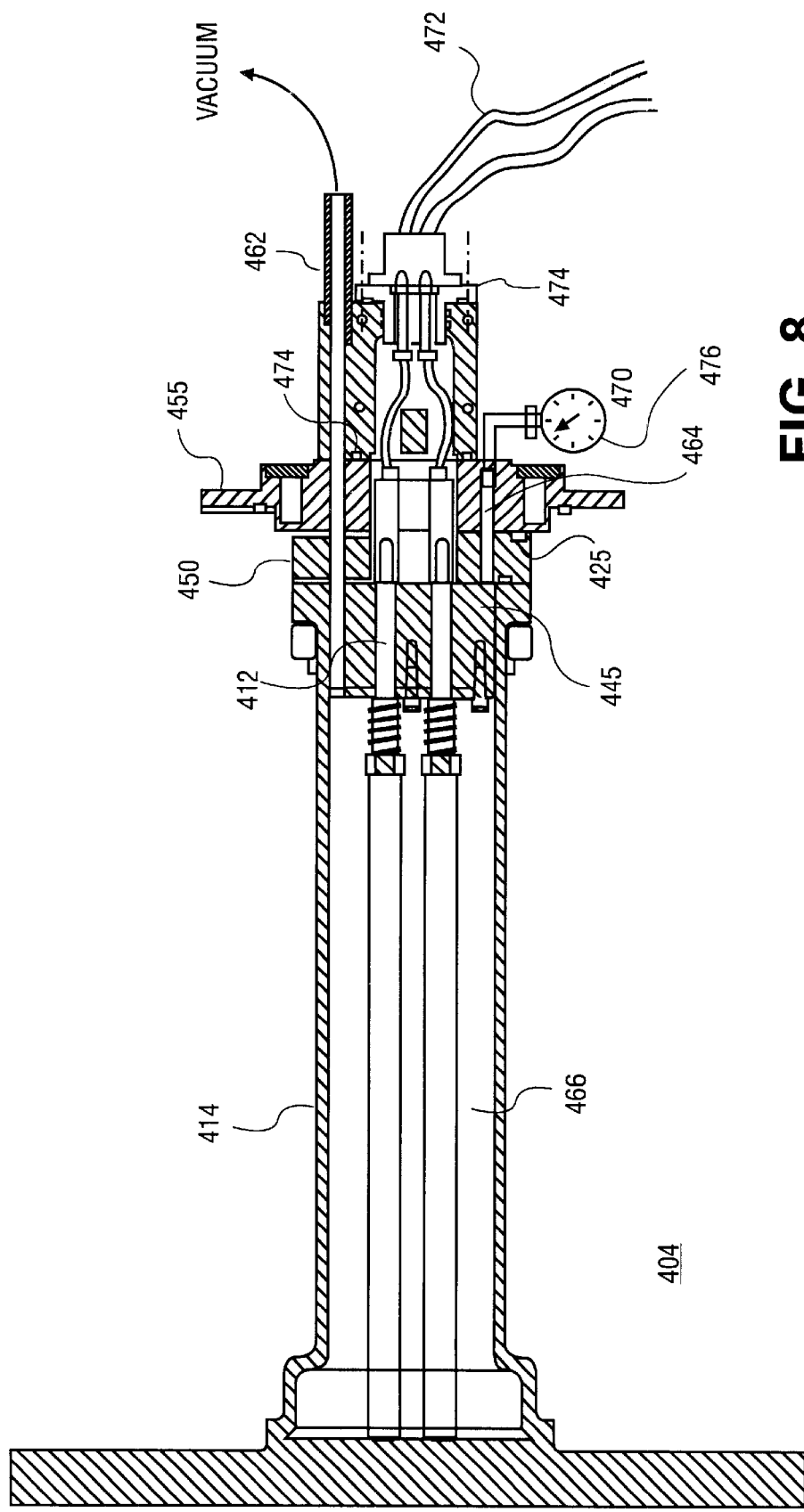
FIG. 8 is an illustration of the resistive heater assembly with vacuum.

Alternatively in an embodiment, as illustrated in FIG. 8, heater interior volume 466 within heater 404 may be evacuated with vacuum to remove the resident atmosphere. Connector assembly 470 connects to heater 404 at one end and provides a multitude of connections 474. Connector assembly 470 attaches to end cap 445, to heater tube 414, and to chamber body 106 (FIG. 1). Passing through connector assembly 470 is vacuum port 462, vent port 464, electrical connections 472 for a thermocouple (not shown), and electrical connections for heater rods 412. Connector assembly 470 includes a connector adapter 450 and a connector base 455. Connector adapter 450 attaches electrical connections 472 to the ends of heater rods 412. Attached to connector adapter 450 is connector base 455 that attaches to chamber body 106 (FIG. 1). Vacuum port 462 passes through end cap 445 to gain access to heater interior volume 466. Attached to vent port 464 may be a vacuum or pressure gauge 476 to monitor vacuum levels. With this connector assembly 470 configuration, a single operation of attaching connector assembly 470 to heater 404 provides for all the electrical and fluid connections simultaneously. Heater 404 acts as a pressure vessel in that it has pressure integrity. This is accomplished with O-rings 475 that are placed between components: heater tube 414, end cap 445, and connector assembly 470, to block vacuum from pulling into the heater interior volume 466 any of the reaction chamber chemistry.

When vacuum is applied to vacuum port 462, the heater interior 466 is subjected to an approximate 5 torr vacuum. In this manner, a vacuum source is continuously applied to interior 466 of heater 404. In addition to monitoring vacuum levels, vacuum gauge 476 may be used to leak check the vacuum integrity of heater interior 466. The ability of heater 404 to hold sufficient vacuum may be confirmed by periodic leak checks that test heater 404 pressure integrity. The leak check may be performed by sealing off heater interior 466 from a vacuum source and monitoring a loss of vacuum over time for a rate of vacuum decay. An approximate vacuum decay rate in the range of 0–2.5 torr per five hours could be acceptable.

It should be appreciated for the described embodiments that modifications and adjustments to the invention might be accomplished. For instance, for the embodiment providing a vacuum in the heater interior 466, it may be determined that for some process temperatures (below 700° C.), the vacuum requirement in the first embodiment may be of a range such as 2.5–10 torr.

It should be appreciated that for the embodiment performing a purge, that a variety of fluids may be used. In particular, any inert gas may be used in substitute for nitrogen such as halogen gases. The purge of inert gas through heater interior 466 may be accomplished at purge rates that vary from 100 ccm dependent on temperature of the inert gas going in and the desired temperature of the heater interior volume 466. Purge pressures other than 30 psi may be applied to fine-tune the purge process. Along with varying the purge flow rate, the purge gas(es) may be cooled or refrigerated to control the temperature within the heater. In addition, instead of a purge port, dimensional tolerancing of the mating connector component could be specified to be a loose tolerance. Such loose tolerancing would provide spaces between components that may allow the purge gas to leak out between the components at a sufficient rate to eliminate the need for a vent port. It is also possible to purge continuously (non-stop) regardless of wafer processing to further insure that no atmosphere is present within the heater interior during operation.

In another embodiment, an inert gas is purged through the heater until the atmosphere has been removed. At a point, both purge and vent sides are shut off or blocked and the inert gas to a selected pressure would remain standing or static within the pressure vessel. A pressure gauge could be used to confirm that no discernable pressure change had occurred in the heater interior. A discernable pressure loss is any loss that is not acceptable for the design, operation, and useful life of the heater.

In another embodiment, vacuum may be applied to the heater interior volume until a particular vacuum level is reached and then the vacuum source may be shut off to the heater interior volume. A vacuum gauge that is in-line or attached to the vacuum system near or at the heater interior could monitor the vacuum level within the heater interior. This would allow for better notice of loss of vacuum integrity of the heater interior.

I claim:

1. An apparatus for wafer processing, comprising:
   a reaction chamber in which is placed a heater having an interior volume, the interior volume having a seal to isolate the interior volume from the reaction chamber;
   at least one heating element positioned within the interior volume;
   means for supporting a wafer coupled to the heater within the reaction chamber;
   means for maintaining a constant flow of an inert gas through the interior volume of the heater; and
   a vent port coupled to the heater interior volume for exhausting the inert gas from the interior volume to outside the reaction chamber.

2. The apparatus of claim 1, further comprising:
   means for maintaining the inert gas at a pressure within the heater interior volume.

3. The apparatus of claim 2, further comprising:
   means for maintaining the inert gas below 700° C. within the heater interior volume.

4. An apparatus for wafer processing, comprising;
   a wafer reaction chamber containing a heater within the heater comprising:
     a surface coupled to the heater for supporting a wafer within the reaction chamber;
     an interior volume containing at least one heating element and having a seat to isolate the interior volume from the reaction chamber;
     a fluid inlet port to flow a fluid through the interior volume;
     a fluid vent port coupled to the heater interior volume and positioned to vent the fluid from the interior volume to outside the wafer reaction chamber.

5. The apparatus of claim 4, wherein the heater further comprises:
   a connector assembly comprising:

a set of electrical connections that connect to a plurality of heater rods,
the fluid inlet port, and
the fluid vent port.

6. The apparatus of claim 5, wherein the fluid vent port is provided by loose dimensional tolerancing.

* * * * *

UNITED STATES PATENT AND TRADEMARK OFFICE
CERTIFICATE OF CORRECTION

PATENT NO. : 6,652,655 B1  Page 1 of 1
DATED : November 25, 2003
INVENTOR(S) : Ho It is certified that error appears in the above-identified patent and that said Letters Patent is hereby corrected as shown below:

Column 6,
Line 58, delete "seat", insert -- seal --.

Signed and Sealed this

Twentieth Day of April, 2004

JON W. DUDAS
*Acting Director of the United States Patent and Trademark Office*